United States Patent [19]

Mahulikar et al.

[11] Patent Number: 5,545,850
[45] Date of Patent: Aug. 13, 1996

[54] GUARD RING FOR INTEGRATED CIRCUIT PACKAGE

[75] Inventors: Deepak Mahulikar, Madison, Conn.; Paul R. Hoffman, Modesto, Calif.

[73] Assignee: Olin Corporation, New Haven, Conn.

[21] Appl. No.: 373,138

[22] Filed: Jan. 13, 1995

[51] Int. Cl.[6] .................................................. H01L 23/02
[52] U.S. Cl. .......................... 174/52.4; 257/671; 257/787
[58] Field of Search .................................. 174/52.1–52.4; 257/666, 670, 671, 676, 692, 693, 694, 701, 734, 735, 773, 782, 783, 787, 788; 361/813; 29/841, 855

[56] References Cited

U.S. PATENT DOCUMENTS

| | | | |
|---|---|---|---|
| 4,572,924 | 2/1986 | Wakely et al. | 174/52.4 |
| 4,707,724 | 11/1987 | Suzuki et al. | 257/677 |
| 4,721,994 | 1/1988 | Mine et al. | 257/671 |
| 4,882,212 | 11/1989 | SinghDeo et al. | 428/76 |
| 4,888,449 | 12/1989 | Crane et al. | 174/52.4 |
| 4,939,316 | 7/1990 | Mahulikar et al. | 174/52.4 |
| 4,967,260 | 10/1990 | Butt | 257/668 |
| 5,001,546 | 3/1991 | Butt | 257/666 |
| 5,013,871 | 5/1991 | Mahulikar et al. | 174/52.4 |
| 5,025,114 | 6/1991 | Braden | 174/52.4 |
| 5,034,591 | 7/1991 | Fang | 219/121.69 |
| 5,041,901 | 8/1991 | Kitano et al. | 556/434 |
| 5,065,504 | 11/1991 | Olla | 29/827 |
| 5,073,521 | 12/1991 | Braden | 437/209 |
| 5,075,962 | 12/1991 | Gibson | 29/827 |
| 5,098,796 | 3/1992 | Lin et al. | 428/607 |
| 5,122,858 | 6/1992 | Mahulikar et al. | 257/753 |
| 5,124,783 | 6/1992 | Sawaya | 257/724 |
| 5,132,773 | 7/1992 | Bradin et al. | 257/666 |
| 5,134,459 | 7/1992 | Maeda et al. | 257/666 |
| 5,138,429 | 8/1992 | Nayesh et al. | 257/666 |
| 5,152,057 | 10/1992 | Murphy | 29/883 |
| 5,229,642 | 7/1993 | Hara et al. | 257/691 |
| 5,245,215 | 9/1993 | Sawaya | 257/676 |
| 5,250,839 | 10/1993 | Katoh et al. | 257/666 |
| 5,250,842 | 10/1993 | Ikeda | 257/668 |
| 5,252,855 | 10/1993 | Ogawa et al. | 257/676 |
| 5,285,184 | 2/1994 | Kondo et al. | 257/666 |
| 5,343,073 | 8/1994 | Parthasarathi et al. | 257/666 |
| 5,343,074 | 8/1994 | Higgins, III et al. | 257/668 |
| 5,345,039 | 9/1994 | Yamazaki | 174/52.4 |

*Primary Examiner*—Kristine L. Kincaid
*Assistant Examiner*—Christopher Horgan
*Attorney, Agent, or Firm*—Gregory S. Rosenblatt; Robert S. Hauser

[57] ABSTRACT

There is provided a leadframe having a plurality of coplanar electrically conductive leads. At least one metallic guard is bonded to the leads with a dielectric layer disposed between the metallic guard and the leads. The metallic guard has good adhesion to a polymer molding resin such that when the leadframe structure is encased in a molding resin, delamination is minimized. By restricting delamination, the ingress of water and water soluble contaminants to an integrated circuit device is inhibited.

25 Claims, 2 Drawing Sheets

GUARD RING FOR INTEGRATED CIRCUIT PACKAGE

FIELD OF THE INVENTION

This invention relates to a leadframe for an integrated circuit device package. More particularly, a metallic guard ring is bonded to a portion of the leads to maintain lead coplanarity.

DESCRIPTION OF THE PRIOR ART

Integrated circuit ("I.C.") devices such as silicon based semiconductor circuits are encased in a package for protection from mechanical shock and environmental corrosion. In one package, the I.C. device is encased in a polymer molding resin, typically an epoxy.

A leadframe, a thin, typically on the order of 0.005 inch to 0.020 inch, metallic strip formed into a plurality of leads has inner lead portions approaching a central aperture. The I.C. device is positioned within this central aperture and electrically interconnected to the inner lead portions of the leadframe. The I.C. device, the electrical interconnections and the inner lead portions are then encased in the molding resin.

Outer lead portions of the leadframe extend beyond the body of the package and are electrically interconnected to external circuitry.

The inner lead portions of the leadframe typically have a width about equal to the thickness. The inner leads readily deflect and lose coplanarity with adjacent leads. To facilitate automated electrical interconnection of the inner lead portions to the semiconductor device such as by wire bonding or tape automated bonding, it is necessary to maintain lead coplanarity.

One way to maintain lead coplanarity is disclosed in U.S. Pat. No. 4,721,994 by Mine et al, that is incorporated by reference in its entirety herein. The Mine et al patent discloses a polyimide support ring for the inner leads of a leadframe. This support ring is bonded to the leads of the leadframe by a thermally activated silicone adhesive.

Another type of support ring is disclosed in U.S. Pat. No. 5,034,591 to Fang, that is incorporated by reference in its entirety herein. This patent discloses a copper foil bonded to a polymer support layer. Leads are photolithographically formed in the foil and, at the same time, a copper stiffening ring, joining the inner lead portions of all leads is also photolithographically formed. After the leads are bonded to a semiconductor device, that portion of the stiffening ring disposed between leads is excised by laser cutting.

A disadvantage with a polymer support ring is that adhesion between the polymer ring and the molding resin is poor. The interface is vulnerable to delamination. Delamination between the support ring and the molding resin may result in moisture accumulation at the delamination site.

I.C. devices are highly sensitive to corrosion from moisture and water soluble contaminants. Generally, any delamination between the support ring and the molding resin will cause the accumulation of sufficient moisture to damage the semiconductor device.

Polymer support rings are usually hygroscopic. The polymer support rings absorb water leading to a potential for corrosion, electromigration of contaminants leached from the polymer and electrical leakage through the moisture laden polymer.

There remains, therefore, a need for a support ring to maintain the coplanarity of the inner leads of a leadframe that provides improved adhesion to a polymer molding resin.

SUMMARY OF THE INVENTION

Accordingly, it is an object of the invention to provide a guard ring for a leadframe having enhanced adhesion to a polymer molding resin. It is a feature of the invention that the guard ring is metallic and, preferably, coated with an adhesion enhancing layer.

Among the advantages of the metallic guard ring of the invention are improved adhesion to a molding resin reducing the risk of delamination. The metallic guard ring may function as a floating ground to reduce both lead to lead mutual inductance and self inductance as well as mutual capacitance. Alternatively, the metallic guard ring may be electrically interconnected to at least one lead and function as a ground plane or a power plane. Another advantage of the metallic guard ring is that metal is stiffer than most polymers reducing lead distortion, both lead to lead coplanarity and from one side of the leadframe to the other.

Additionally, by proper selection of the metal utilized in the metallic guard ring, an exact coefficient of thermal expansion match with the leadframe can be achieved. This matched coefficient of thermal expansion reduces leadframe distortion during heating. Typically, during wire bonding, the leadframe is heated to temperatures of up to 250° C.

In accordance with the invention, there is provided a leadframe structure. This leadframe structure contains a plurality of generally coplanar electrically conductive leads. Each lead has an inner lead end and an outer lead end with the inner lead ends approaching a central aperture. At least one metallic guard ring is bonded to the electrically conductive leads. This metallic guard ring is spaced from about 0.5 mm to about 5.0 mm from the inner lead ends. A dielectric layer is disposed between the metallic guard ring and the electrically conductive leads.

In accordance with the invention, there is also provided a package to house one or more semiconductor devices. This package contains a leadframe with a plurality of generally coplanar conductive leads. Each of the leads contains an inner lead end and an outer lead end with the inner lead ends approaching a central aperture. At least one semiconductor device is disposed within this central aperture and electrically interconnected to the inner lead ends. A metallic guard ring is bonded to the leadframe at a position separated from the central aperture by the electrical interconnection between the semiconductor device and the inner lead ends. A dielectric layer is disposed between the metallic guard and the leadframe. Finally, a polymer resin encapsulates the semiconductor device, the metallic guard ring and the inner lead portions.

The above stated objects, features and advantages will become more apparent from the specification and drawings that follow.

DETAILED DESCRIPTION

Figure 1:
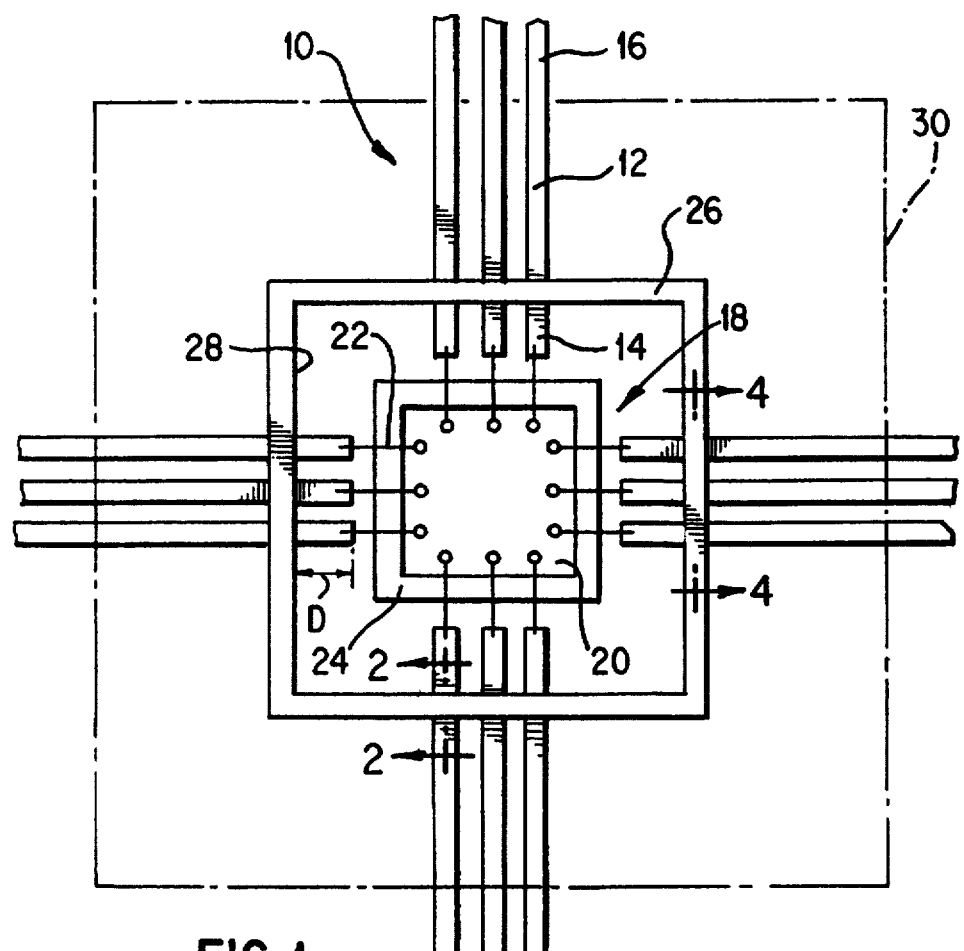
FIG. 1 shows in top planar view a guard ring in accordance with the invention.

FIG. 1 shows in top planar view a leadframe structure 10 containing a plurality of generally coplanar electrically conductive leads 12. Each of the leads 12 has an inner lead end 14 and an outer lead end 16. The inner lead ends 14 approach a central aperture 18. Disposed within this central aperture 18 is at least one integrated circuit device 20.

The leads 12 are formed from any suitable electrically conductive material such as copper, aluminum and alloys thereof. Alloys of iron and nickel are also satisfactory. The leads 12 have a thickness of from about 0.005 inch to about 0.02 inch and more typically, from about 0.006 inch to about 0.01 inch. The width of the leads 12 is about equal to the thickness of the leads or slightly larger.

The I.C. device 20 is electrically interconnected to the inner lead ends 14 by an electrical interconnection 22 that may be thin, on the order of 0.001 inch diameter, copper, aluminum or gold wires or a thin strip, typically on the order of 0.0005–0.002 inch, copper foil.

To facilitate assembly of the electrical interconnections 22, the I.C. device 20 is typically mounted to a die paddle 24. The die paddle 24 is generally formed from the same material as the leads 12 and is supported by tie bars (not shown) extending to the periphery of the leadframe structure 10. To maintain lead coplanarity, a metallic guard ring 26 is provided. The guard ring 26, which is generally rectangular in shape, circumscribes the central aperture 18 and supports the inner lead ends 14 and prevents shifting of the leads. The guard ring 26 may be a contiguous ring as illustrated in FIG. 1 or comprise four separate strips, each forming one leg of the guard ring or various combinations of a partial ring and strips. The guard ring 26 is bonded to the inner leads 14, typically with a polymer resin such as an acrylic adhesive.

To provide for the electrical interconnections 22, an interior edge 28 of the guard ring 26 is spaced from the inner lead end 14 by a distance, "D", of from about 0.5 mm to about 5.0 mm Preferably, "D" is from about 1.0 mm to about 4.0 mm.

The electronic package is completed by encapsulating the integrated circuit device 20, the guard ring 26 and the inner lead portions 14 in a polymer molding resin, designated by broken line 30, with the outer lead ends 16 extending beyond the molding resin 30.

Alternatively, the electronic package is completed by encasing the integrated circuit device 20, the guard ring 26 and the inner lead portions 14 between separate base and cover components of the type disclosed in U.S. Pat. No. 4,939,316 to Mahulikar et al. that is incorporated by reference in its entirety herein.

Figure 2:
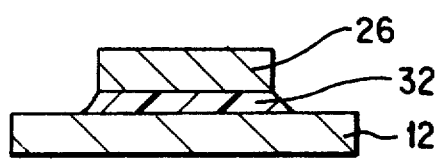
FIG. 2 shows in cross-sectional representation a first embodiment of the guard ring illustrated in FIG. 1.

FIG. 2 illustrates in cross-sectional representation that portion of the leadframe structure 10 designated by the broken arrow 2—2 in FIG. 1. The guard ring 26 is bonded to the lead 12 by an adhesive 32. To prevent the leads 12 from being electrically interconnected one to another, a dielectric layer is disposed between the guard ring 26 and at least some of the electrically conductive leads 12. This dielectric layer may take the form of the adhesive 32 being a dielectric polymer 32 such as an acrylic resin.

The guard ring 26 is formed from any suitable metal, metal alloy or metal compound. Typically, the thickness of the guard ring is from about 0.001 inch to about 0.004 inch with a preferred thickness of from about 0.0015 inch to about 0.003 inch. If the guard ring is too thin, inadequate support of the inner lead portions is provided and lead to lead coplanarity may be lost. If the guard ring is too thick, it is difficult to handle and apply.

Preferred metals for the guard ring 32 are copper, aluminum and alloys thereof. A most preferred material is an aluminum alloy designated by the Aluminum Association as a 3000 Series Alloy, containing manganese as the major alloying element or an alloy designated as a 6000 Series Alloy, containing silicon and magnesium in approximate proportions to form magnesium silicide. Representative of these alloys are aluminum alloy 3003 containing 0.05–0.20% by weight copper, 1.0–1.5% manganese and the balance aluminum and aluminum alloy 6061 containing 0.40–0.8% by weight silicon, 0.15%–0.40% copper, 0.8–1.2% magnesium, 0.04–0.35% chromium and the balance aluminum.

Aluminum alloys are preferred because an anodic film is readily formed on the surface of the guard ring by electrochemical processing. This anodic film provides both electrical isolation for the guard ring, as well as enhances adhesion to a molding resin.

Figure 3:
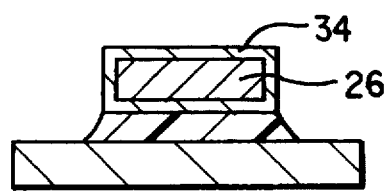
FIG. 3 shows in cross-sectional representation a second embodiment of the guard ring illustrated in FIG. 1.

FIG. 3 illustrates in cross-sectional representation a guard ring 26 coated with an exterior layer 34. This exterior layer 34 is any suitable material that enhances the adhesion of the guard ring 26 to a molding resin. Suitable coating materials include an anodic layer, such as anodized aluminum, and a mixture of chromium and zinc as generally disclosed in U.S. Pat. No. 5,367,196 to Mahulikar et al that is incorporated by reference in its entirety herein.

Other suitable coatings include nickel and nickel alloys, tin and tin alloys, as well as chromium and chromium alloys as described in U.S. Pat. No. 4,888,449 to Crane et al that is also incorporated by reference in its entirety herein. Polymer coatings that enhance adhesion, such as an epoxy dip are also suitable. Any of the coatings may be provided with a macroscopic surface roughness, such as $R_{max}>10$ microns to further enhance adhesion to the molding resin.

The exterior layer 34 has a thickness of from about 1 micron to about 25 microns and preferably, the thickness of this exterior layer 34 is from about 2 microns to about 15 microns.

Figure 4:
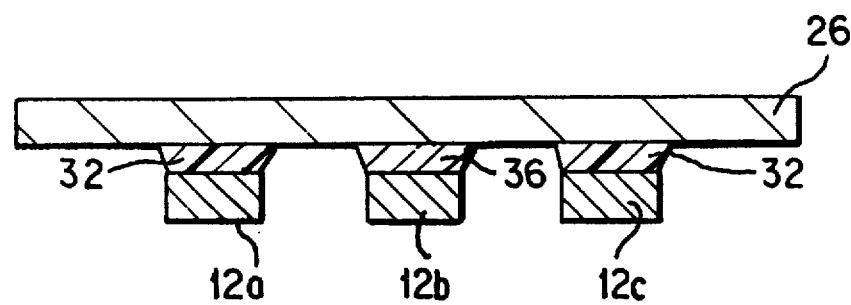
FIG. 4 shows in cross-sectional representation a third embodiment of the guard ring illustrated in FIG. 1.

For certain electrical applications, the guard ring 26 may constitute a portion of an electric circuit as illustrated in cross-sectional representation in FIG. 4. A plurality of leads 12a, 12b and 12c are bonded to the metallic guard ring 26. Leads 12a and 12c are electrically isolated from the guard ring 26 by a dielectric adhesive 32. Lead 12b is bonded to the guard ring 26 by a conductive material 36 such as a polymer adhesive filled with an electrically conductive material such as silver, copper or graphite, or by a wire bond. Alternatively, the conductive adhesive 36 may be a low melting temperature solder such as a lead-tin alloy. In this embodiment, the guard ring 26 functions as a ground plane or a power plane to provide all electrically interconnected leads 12b at the same voltage potential.

Figure 5:
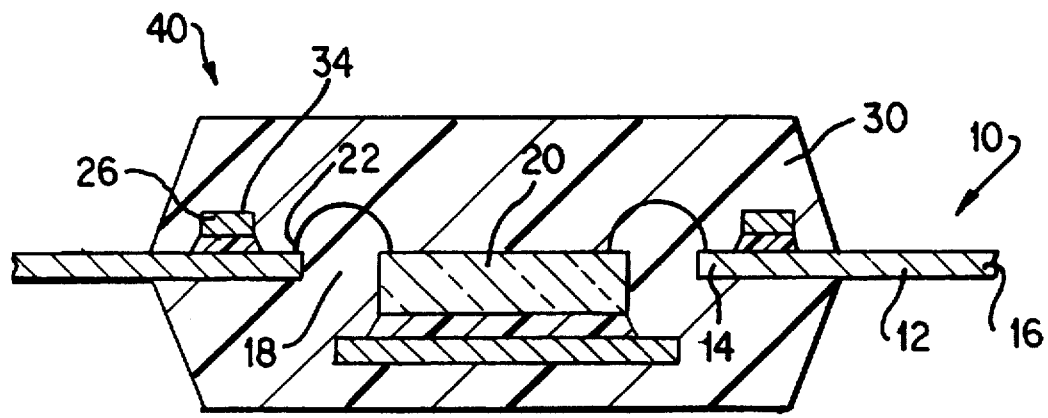
FIG. 5 shows in cross-sectional representation a molded plastic package in accordance with an embodiment of the invention.

FIG. 5 illustrates in cross-sectional representation an electronic package 40 housing one or more I.C. devices 20 in accordance with the invention. A leadframe 10 contains a plurality of generally coplanar conductive leads 12 with inner lead portions 14 approaching a central aperture 18. Outer lead portion 16 of the leads 12 extend beyond the electronic package 40 perimeter as defined by a polymer molding resin 30. A metallic guard ring 26, preferably coated with an adhesion enhancing exterior layer 34, is bonded to the leads at a position separated from the central aperture 18 by the electrical interconnections 22. To provide electrical isolation between the leads 12, a dielectric layer is disposed between the metallic guard and either all, or most of the leads of the leadframe. As described above, it is within the scope of the invention for a number of the leads to be electrically interconnected to the metallic guard ring to be at the same voltage potential. The polymer molding resin 30 then encapsulates the I.C. devices 20, the metallic guard 26 and the inner lead portions 14.

In the preceding embodiments, the metallic guard 26 was identified in the Figures as on the same side of the leads as the electrical interconnections. However, the metallic guard, when in the form of a rectangular ring, may be disposed on either side of the leadframe.

Figure 6:
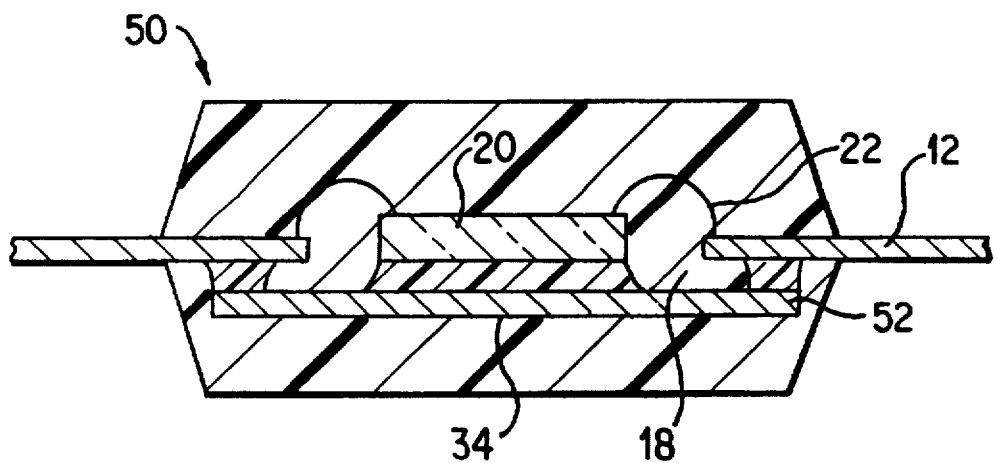
FIG. 6 shows in cross-sectional representation a molded plastic package in accordance with another embodiment of the invention.

FIG. 6 illustrates another electronic package 50 having a metallic guard 52 disposed on the side of the leads 12 opposite the electrical interconnections 22 and extending across the central aperture 18. The metallic guard 52 is a generally rectangular plate that is separated from the electrical interconnections 22 by the leadframe. The semiconductor device 20 is then bonded to the metallic guard 52 which then, in addition to maintaining inner lead coplanarity, is a heat spreader to dissipate heat from the semiconductor 20. This embodiment has the further advantage that it is not necessary to provide a die paddle to support the I.C. device 20. As in earlier embodiments, the metallic guard 52 is preferably coated with an adhesion enhancing exterior layer 34.

While the invention has been described in terms of metallic guard rings to support inner leads to maintain inner lead coplanarity, it is within the scope of the invention to provide a similar guard ring to an outer lead portion of the leads, external of the package perimeter as defined by the molding resin, to support the leads during assembly. Typically, the outer lead guard ring is severed prior to electrical interconnection of the outer leads to external circuitry.

It is apparent that there has been provided in accordance with this invention a metallic guard ring to support the inner leads of a leadframe that fully satisfies the objects, features and advantages set forth hereinabove. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A leadframe structure, comprising:
   a plurality of generally coplanar electrically conductive leads having an inner lead end and an outer lead end, said inner lead ends approaching a central aperture;
   at least one metallic guard, having a metallic core, bonded to said electrically conductive leads, said at least one metallic guard having a first edge spaced from about 0.5 mm to about 5.0 mm from each of said inner lead ends; and
   an adhesive layer disposed between said at least one metallic guard and said electrically conductive leads.

2. The leadframe structure of claim 1 wherein said metallic guard is coated with an adhesion enhancing exterior layer.

3. The leadframe structure of claim 2 wherein said adhesion enhancing exterior layer has a thickness of from about 1 micron to about 25 microns.

4. The leadframe structure of claim 2 wherein said metallic guard is formed from aluminum or an aluminum alloy.

5. The leadframe structure of claim 4 wherein said adhesion enhancing exterior layer is anodized aluminum.

6. The leadframe structure of claim 4 wherein said adhesion enhancing exterior layer is a mixture of chromium and zinc.

7. The leadframe structure of claim 2 wherein said metallic guard is formed from copper or a copper alloy.

8. The leadframe structure of claim 7 wherein said adhesion enhancing exterior layer is a mixture of chromium and zinc.

9. The leadframe structure of claim 7 wherein said adhesion enhancing exterior layer is nickel or a nickel alloy.

10. The leadframe structure of claim 2 wherein at least one of said leads is electrically interconnected to said metallic guard.

11. The leadframe structure of claim 2 wherein said metallic guard is a rectangular ring circumscribing said central aperture.

12. The leadframe structure of claim 2 wherein said metallic guard is a rectangular plate extending across said central aperture.

13. A package to house one or more integrated circuit devices, comprising:
   a leadframe containing a plurality of generally coplanar conductive leads having an inner lead end and an outer lead end with said inner lead ends approaching a central aperture;
   at least one integrated circuit device disposed within said central aperture;
   an electrical interconnection joining said at least one integrated circuit device to said inner lead ends;
   a metallic guard having an adhesion enhancing exterior layer bonded to said leadframe and separated from said central aperture by said electrical interconnection;
   a dielectric layer disposed between said metallic guard and said leadframe; and
   a polymer resin encapsulating said at least one integrated circuit device, said metallic guard and said inner lead portions.

14. The package of claim 13 wherein said metallic guard is formed from aluminum or an aluminum alloy.

15. The package of claim 14 wherein said adhesion enhancing exterior layer is anodized aluminum.

16. The package of claim 13 wherein said metallic guard is formed from copper or a copper alloy.

17. The package of claim 16 wherein said adhesion enhancing exterior layer is a mixture of chromium and zinc.

18. The package of claim 13 wherein at least one of said leads is electrically interconnected to said metallic guard.

19. A package to house one or more integrated circuit devices, comprising:
   a leadframe containing a plurality of generally coplanar conductive leads having an inner lead end and an outer lead end with said inner lead ends approaching a central aperture;
   at least one integrated circuit device disposed within said central aperture;
   an electrical interconnection joining said at least one integrated circuit device to said inner lead ends;

a metallic guard coated with an adhesion enhancing exterior layer bonded to said leadframe and separated from said electrical interconnection by said leadframe;

a dielectric layer disposed between said metallic guard and said leadframe; and a polymer resin encapsulating said at least one integrated circuit device, said metallic guard and said inner lead ends.

20. The package of claim 19 wherein said metallic guard is formed from aluminum or an aluminum alloy.

21. The package of claim 20 wherein said adhesion enhancing exterior layer is anodized aluminum.

22. The package of claim 19 wherein said metallic guard is formed from copper or a copper alloy.

23. The package of claim 22 wherein said adhesion enhancing exterior layer is a mixture of chromium and zinc.

24. The package of claim 19 wherein said metallic guard is a rectangular plate extending across said central aperture.

25. A package to House one or more integrated circuit devices, comprising:

a leadframe containing a plurality of generally coplanar conductive leads having an inner lead end and an outer lead end with said inner lead ends approaching a central aperture;

at least one integrated circuit device disposed within said central aperture;

an electrical interconnection joining said at least one integrated circuit device to said inner lead ends;

a metallic guard coated with an adhesion enhancing exterior layer and bonded to said leadframe external of a polymer resins, said polymer resin encapsulating said at least one integrated circuit device, said metallic guard and said inner lead ends; and a dielectric layer disposed between said metallic guard and said leadframe.

* * * * *